(12) United States Patent
Bernacchia

(10) Patent No.: US 7,710,167 B2
(45) Date of Patent: May 4, 2010

(54) CIRCUITS AND METHODS FOR CONTROLLING AN ON/OFF STATE OF A SWITCH

(75) Inventor: Giuseppe Bernacchia, Noventa Padovana (IT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 11/875,894

(22) Filed: Oct. 20, 2007

(65) Prior Publication Data
US 2008/0100378 A1 May 1, 2008

(30) Foreign Application Priority Data
Oct. 30, 2006 (EP) .................................. 06022626

(51) Int. Cl.
 *H03B 1/00* (2006.01)
 *H03K 3/00* (2006.01)
(52) U.S. Cl. .................. 327/108; 327/110; 327/111
(58) Field of Classification Search ............... 327/108, 327/110, 111
See application file for complete search history.

(56) References Cited

U.S. PATENT DOCUMENTS

| 5,365,118 | A | | 11/1994 | Wilcox | |
|---|---|---|---|---|---|
| 5,705,919 | A | * | 1/1998 | Wilcox | 323/282 |
| 5,719,521 | A | * | 2/1998 | Wong | 327/434 |
| 6,037,720 | A | | 3/2000 | Wong et al. | |
| 6,353,345 | B1 | * | 3/2002 | Yushan et al. | 327/112 |
| 6,822,399 | B2 | | 11/2004 | Feldtkeller et al. | |
| 2006/0017466 | A1 | | 1/2006 | Bryson | |
| 2006/0132194 | A1 | * | 6/2006 | Harriman | 327/108 |

FOREIGN PATENT DOCUMENTS

| EP | 0330628 | 8/1989 |
|---|---|---|
| EP | 2006034030 | 2/2006 |
| JP | 2006034030 | 2/2006 |

OTHER PUBLICATIONS

European Search Report for EP06022626.3-1233 dated May 18, 2007.

* cited by examiner

*Primary Examiner*—Lincoln Donovan
*Assistant Examiner*—John W Poos
(74) *Attorney, Agent, or Firm*—Banner & Witcoff, Ltd.

(57) ABSTRACT

A circuit having a first circuit portion configured to receive a pulse-width modulated first signal and a second signal, and configured to generate third and fourth signals each responsive to the first and second signals; a second circuit portion configured to receive the third and fourth signals and to generate a fifth signal responsive to both the third and fourth signals; and a third circuit portion configured to control an on/off state of a first switch in response to the fifth signal, wherein the second signal is present at a load path terminal of the first switch. Also, various related methods.

28 Claims, 7 Drawing Sheets

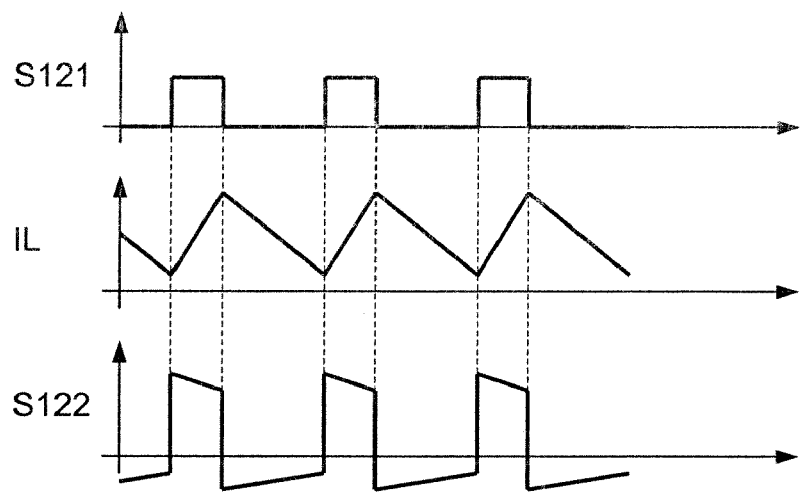
Fig. 6a  (continuous conduction mode)
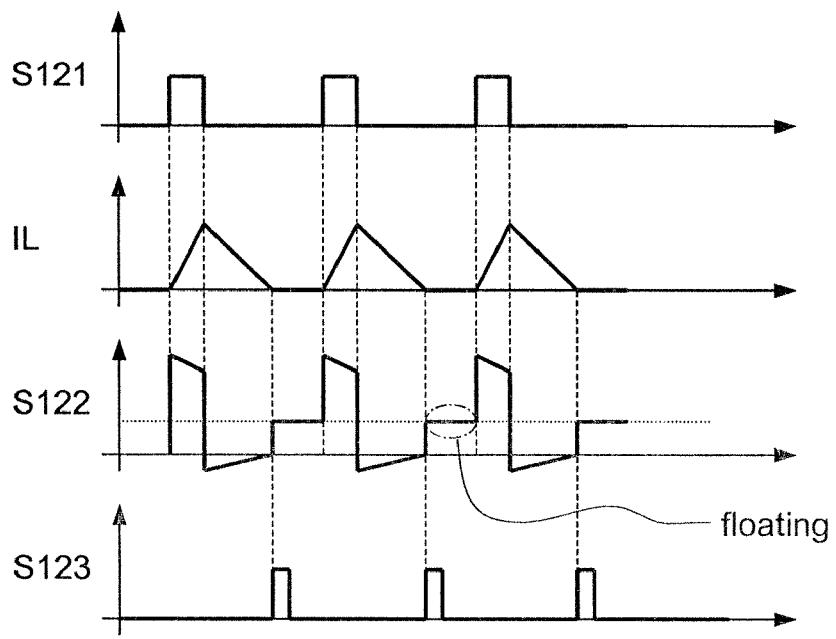
Fig. 6b  (discontinuous conduction mode)

CIRCUITS AND METHODS FOR CONTROLLING AN ON/OFF STATE OF A SWITCH

CROSS-REFERENCE TO RELATED APPLICATIONS

This application claims priority to European patent application no. 06 022 626.3-1233, filed Oct. 30, 2006, hereby incorporated by reference as to it entirety.

BACKGROUND

Switching regulators with half-bridge circuits commonly use a bootstrap circuit having a diode and a bootstrap capacitor connected in series. The bootstrap circuit is typically connected to a node between a high-side transistor and a low-side transistor. To minimize chip size, the size of the bootstrap capacitor is kept small, thereby also keeping the capacitance small. With the reduced capacitance of the bootstrap capacitor, the power consumption of the floating logic being supplied by the bootstrap capacitor becomes more relevant. Ideally, to alleviate the problems associated with a small bootstrap capacitance, the charge stored in the boot strap capacitor should be maximized and the power consumption of the logic circuits supplied by the bootstrap capacitor should be minimized.

The charge stored in the boot strap capacitor can be increased if the diode connected between the supply voltage and the bootstrap capacitor is replaced by a device having a lower voltage drop than a silicon diode. For this reason it is known to employ a Schottky diode instead of a silicon diode. However, this approach is unfavorable, because when using common chip fabrication processes Schottky diodes cannot be easily integrated and so have to be realized as an external component.

For various reasons, the high-side transistor is not driven directly by a level-shifted version of an input signal, but rather via a floating latch which is turned on and turned off by short pulses. In order to reduce a degradation of the signal due to noise, low resistor values are used in the level-shifter resulting in a high load of the bootstrap capacitor. The average load of the bootstrap capacitor can be reduced by triggering only short pulses which are then level shifted. This level shifted pulses trigger the floating latch, thus restoring the signal controlling the switching state of the high-side switch.

There is a general need for a circuit arrangement and for a method for driving a high-side transistor. Such a circuit arrangement may allow for a relatively simple solution which may provide a fail-safe operation without the necessarily using additional refresh circuits, and may further allow integration into a single chip without necessarily using external components.

SUMMARY

Various aspects are described herein. For example, various illustrative circuits are described herein that have a first circuit portion configured to receive a pulse-width modulated first signal and a second signal, and configured to generate third and fourth signals each responsive to the first and second signals; a second circuit portion configured to receive the third and fourth signals and to generate a fifth signal responsive to both the third and fourth signals; and a third circuit portion configured to control an on/off state of a first switch in response to the fifth signal, wherein the second signal is present at a load path terminal of the first switch. Also, various illustrative methods are described herein for performing these and other functions of the circuits.

These and other aspects will be described with reference to illustrative embodiments in the Detailed Description.

BRIEF DESCRIPTION OF THE DRAWINGS

Various aspects as described herein can be better understood with reference to the following drawings and detailed description. The components in the figures are not necessarily to scale, and instead emphasis is placed upon illustrating the principles of the invention. Moreover, in the figures, like reference numerals designate corresponding parts.

FIG. 4b is an illustrative timing diagram of the input and output signals of the single-conditioning circuit shown in FIG. 4a.

FIG. 5b is an illustrative timing diagram of the input and output signals of the enhanced signal-conditioning circuit showed in FIG. 5a.

FIG. 6a is an illustrative timing diagram of the input signal, the load-current and the phase-feedback signal for continuous conduction mode.

FIG. 6b is an illustrative timing diagram of the input signal, the load-current, the phase-feedback signal and a zero-detection signal for the discontinuous conduction mode.

FIG. 7b is an illustrative timing diagram of the output and the input signals of the signal-conditioning circuit of FIG. 7a.

DETAILED DESCRIPTION

Figure 1:
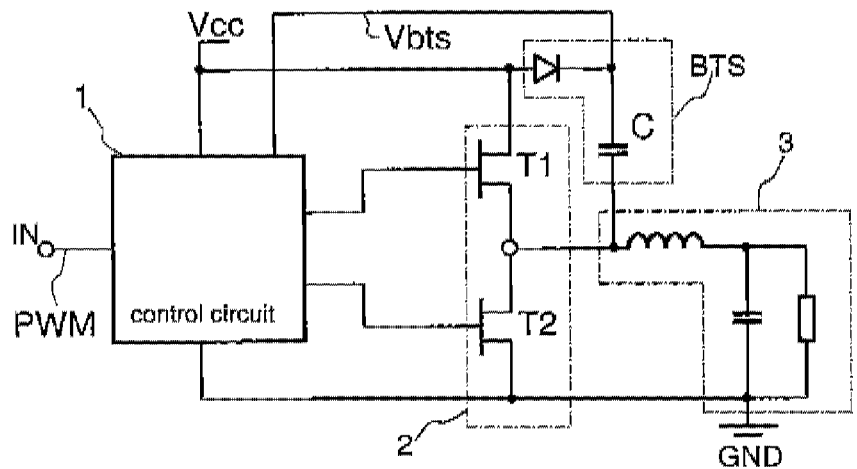
FIG. 1 is a schematic diagram of a conventional control circuit with a half-bridge comprising a high-side semiconductor switch and a low-side semiconductor switch.

The various aspects described herein may be embodied in various forms. The following description shows by way of illustration various examples in which the aspects may be practiced. It is understood that other examples may be utilized, and that structural and functional modifications may be made, without departing from the scope of the present disclosure.

Except where explicitly stated otherwise, all references herein to two or more elements being "coupled," "connected," and "interconnected" to each other is intended to broadly include both (a) the elements being directly connected to each other, or otherwise in direct communication with each other, without any intervening elements, as well as (b) the elements being indirectly connected to each other, or otherwise in indirect communication with each other, with one or more intervening elements.

Various illustrative embodiments of a circuit arrangement and a method are described for driving a high-side semiconductor switch, for instance in the output stage of a buck-converter or in switching voltage regulator modules.

One example of such an arrangement for driving a high-side semiconductor switch comprises a signal-conditioning circuit receiving an input signal, a floating logic circuit connected to the signal-conditioning circuit, and a floating driver circuit connected between the floating logic circuits and a control terminal of the high-side switch. Besides the input signal, which can be pulse-width modulated, the signal conditioning circuit receives a phase-feedback signal from a second load terminal (e.g. a source terminal) of the high-side transistor. By the use of the received signals the signal-conditioning circuit provides a set signal which is set to a first logic level (e.g. a high level) at a first edge (e.g. a raising edge) of the input signal and to a second logic level (e.g. a low level) at a corresponding edge of the phase-feedback signal, but not before a certain delay time has elapsed. The signal conditioning circuit further provides a reset signal, which is set to a first logic level (e.g. a high level) at a second edge (e.g. a falling edge) of the input signal and to a second logic level (e.g. a low level) at a corresponding edge of the phase-feedback signal, but not before the certain delay time has elapsed. All the signals in this signal-conditioning circuit may not be floating but may instead refer to a fixed reference potential, e.g. a ground potential. In essence, the signal conditioning circuit may generate a set pulse at the first edge (e.g. a raising edge) of the input signal and a reset pulse at a second edge (e.g. a falling edge) of the input signal. The width of the pulses may be determined by the time the phase-feed signal needs to react to a set- or a reset pulse. However, a minimum pulse-width may be provided.

In this example, the floating logic circuits receiving the set signal and the reset signal from the signal-conditioning circuits may provide an output signal, which may be essentially a level-shifted version of the input signal mentioned above. Therefore the set signal showing only short set pulses and the reset signal showing only short reset pulses may be level-shifted to obtain floating set- and reset signals with respect to the potential of the phase-feedback signal, i.e. with respect to the potential of the source terminal of the high-side switch. The floating logic circuit may further comprise a floating latch, which may be triggered by the floating and level-shifted versions of the set- and the reset signal and which may set the above mentioned floating output signal to a first logic level (e.g. a high level) when receiving a set pulse and to a second logic level (e.g. a low level) when receiving a reset pulse.

The output signal provided by this floating logic circuit may be received by the floating driver circuit which is connected to a control terminal of the high-side switch and which may directly control the switching state of the high-side switch.

The circuit arrangement may comprise a bootstrap circuit having a bootstrap capacitor with a first terminal connected to the second load terminal (e.g. the source terminal) of the high-side switch and with a second terminal connected to a second supply potential via the load-path of a switching-device, which is also part of the boot strap circuit. The switching-device may comprise a control terminal, which receives a control signal also provided by the above mentioned floating logic circuit. In this example, the floating-logic circuit may be adapted for turning on the switching-device at a first edge of the reset signal (i.e. when receiving the reset pulse) unless it is already switched on and it may be adapted for turning off the switching device at a first edge of the set signal (i.e. when receiving set pulse).

In another example, the circuit arrangement may further comprise a low-side switch with a first load terminal (e.g. a drain terminal), a second load terminal (e.g. a source terminal) and a control terminal (e.g. a gate terminal), its first load terminal being connected to the second load terminal of the high-side switch and its second load terminal being connected to ground potential. The connected high-side switch and low-side switch together may form a half bridge. The common node of the two switches (the second load terminal of the high-side switch and the first load terminal of the low-side switch respectively) may form the output terminal of the half-bride which is also called the phase terminal providing the phase-feedback signal mentioned above. In this example, the circuit arrangement may also comprise a zero-detection device adapted for directly or indirectly detecting a zero-crossing of a load-current provided by the phase terminal to a load circuit and adapted for providing a zero-detection signal, which is received by the above mentioned signal-conditional circuit.

When the load current becomes zero while the low-side switch is in an on-state, the low-side switch may switch to a high ohmic state in order to inhibit a discharging of a capacitor in the load circuit through the low-side switch. If the low-side switch has been switched off, the common node of the high-side switch and the low-side switch, i.e. the phase terminal, may become floating and its potential may be determined by the load-circuit. Therefore, the switching device which the boot strapped capacitor is loaded through also may be switched off in order to inhibit discharging of the boot strapped capacitor. This can be done with little effort by generating another reset pulse in the signal conditioning logic which is transported to floating logic via the level-shifter, the floating logic being adapted to turn off the switching-device when receiving a reset signal while the switching device is already in an on-state.

The charge being stored in the bootstrap capacitor may be maximized by using a switching-device for charging the bootstrap capacitor instead of using a diode with a relatively high voltage drop. The power consumption of the floating logic may be minimized by using the phase-feedback signal which allows short set- and reset pulses, which may be just as long as necessary for triggering the floating gate, thus minimizing the power-consumption of the hole floating logic especially of the level shifter.

According to an illustrative method of controlling a high-side switch, the high-side semiconductor switch may be controlled such that the high-side switch is turned on at a first edge (e.g. a rising edge) of an input signal and is turned off at a second edge (e.g. a falling edge) of the input signal. The method may comprise, for example, the following:

(a) Setting a set signal to first logic level (e.g. a high level) at a first edge (e.g. a rising edge) of an input signal and resetting the set signal to a second logic level (e.g. a low level) at the corresponding edge of a phase-feedback signal but not before a certain delay time has elapsed. The input signal and the set signal both refer to a ground potential; and (b) Setting a reset signal to a first logic level (e.g. a high level) at a second edge (e.g. a falling edge) of the input signal and resetting the reset signal to a second logic level (e.g. a low level) at a corresponding edge of a phase-feedback signal but not before a certain delay time has elapsed.

Like the set signal, the reset signal may also refer to ground potential. In the steps (a) and (b), set- and reset pulses are generated in response to first and second edges of the input signal respectively. The duration of the set- and the reset pulses may be just as long as necessary for the phase-feedback signal to react. The illustrative method may further include the following:

(c) Level shifting the set signal and the reset signal to provide floating versions thereof which refer to the potential of the phase-feedback signal; and (d) Setting an output signal to a first logic level (e.g. a high level) at a second edge (e.g. a falling edge) of the floating version of the set signal and resetting the output signal to a second logic level (e.g. a low level) at the corresponding edge of the floating version of the reset signal.

Like the set- and the reset signals, the output signal may also be floating and refer to a potential of the phase-feedback signal. The illustrative method may further include:

(e) Turning on or off the high-side switch dependent on the logic level of the output signal.

According to another example, the method may additionally include:

(f) Turning on a switching-device for charging a bootstrap capacitor at a first edge (e.g. a rising edge) of the reset signal; and (g) Turning off the switching device at a first edge (e.g. a rising edge) of the set signal.

According to a further example, the method may include:

(h) Detecting a zero-crossing of a load-current provided by a half-bridge formed of the high-side switch and a low-side switch, setting a zero-detection signal to a first logic level (e.g. a high level) when a zero-crossing has been detected and resetting it to a second logic level (e.g. a low level) after a certain delay time has elapsed;

(i) Turning off the above-mentioned switching-device at a first edge of zero-detection signal; and (j) Turning off the low-side switch at a first edge of the zero detection signal.

A conventional switching regulator with a half-bridge circuit is shown in FIG. 1. The half-bridge circuit of FIG. 1 has two n-channel metal-oxide-semiconductor (MOS) transistors T1 and T2 whose drain-source paths are connected in series. This series circuit is connected to a supply potential VCC and to a reference potential GND. A control circuit 1 is employed for driving the MOS transistors T1 and T2. The control circuit is connected to the gates of the MOS transistors T1 and T2, to the supply potential VCC, as well as to the reference potential GND for supply purposes. A bootstrap-supply circuit provides a bootstrap-supply voltage VBTS to the control circuit 1 in order to enable the control circuit 1 to generate a driving signal with a potential high enough to drive the gate of the high-side transistor T1 of the half-bridge to.

A load circuit 3 having a complex impedance is connected between a common node of the high-side transistor T1 and the low-side transistor T2 and ground potential GND. The load circuit 3 may comprise an inductor connected in series to a capacitor and a resistor connected in parallel to the capacitor. The voltage drop across the resistor, i.e. the output voltage, is substantially determined by an input signal PWM.

The control circuit 1 controls the gates of the high-side transistor T1 and the low-side transistor T2 such that the potential of the common node substantially follows the input signal PWM.

The circuit of FIG. 1 comprises a commonly used bootstrap circuit having a diode and a bootstrap capacitor C connected in series between the supply potential VCC and the source terminal of the high-side transistor T1, i.e. the common node of the high-side transistor T1 and the low-side transistor T2. If the common node of the transistors goes to a low level, the bootstrap capacitor C is charged through the diode up to a voltage equal to the supply potential VCC minus the voltage drop across the diode and across the low side transistor T2. If the common node of the transistors T1 and T2 switches to a high level, discharging of the bootstrap capacitor C is inhibited by the diodes and consequently the bootstrap capacitor C can provide a floating bootstrap supply voltage VBTS with respect to the source terminal of the high-side transistor T1. The control circuit 1 is connected to the common node of the diode and the bootstrap capacitor C, thus enabling the control circuit 1 to provide signals with a potential well above the potential of the source terminal of the high-side transistor T1.

Figure 2:
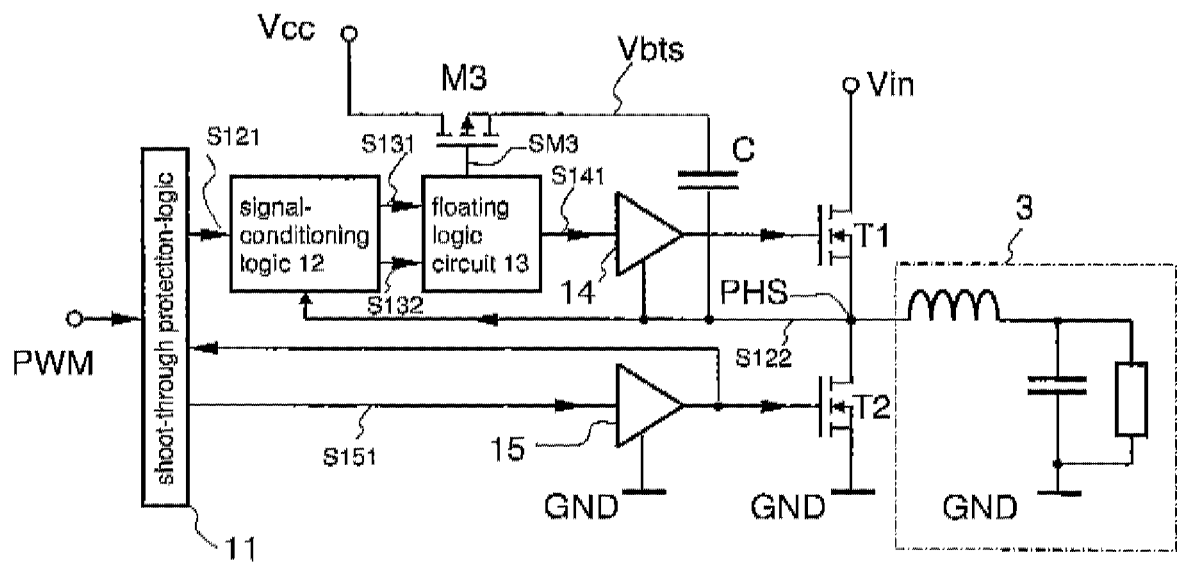
FIG. 2 is a schematic diagram of an illustrative embodiment of a circuit arrangement comprising a signal conditioning circuit, a floating logic circuit, a floating driver, a high-side semiconductor switch, a bootstrap capacitor and a switching-device for charging the bootstrap capacitor.

FIG. 2 shows a schematic of an illustrative embodiment of a circuit arrangement that comprises a signal-conditioning circuit 12, a floating logic circuit 13, a floating driver 14 for driving a high side semiconductor switch T1 and a driver 15 for driving a low side semiconductor switch T2. The high side switch T1 and the low side switch T2 are connected in series to form a half bridge. Therefore, the drain terminal of the high side switch T1 receives a first supply voltage Vin, the source terminal of the high side switch T1 and drain terminal of the low side switch T2 are connected together to form a phase terminal PHS, and the source terminal of the low side switch T2 is connected to ground potential. The common node of the high side switch T1 and the low side switch T2, i.e. the phase terminal PHS, is connected to a load circuit 30.

The signal conditioning circuit 12 receives an input signal S121 and a phase-feedback signal S122 and provides a set signal S131 and a reset signal S132. The input signal S121 is a pulse width modulated signal whose duty-cycle determines the mean output voltage of the phase terminal PHS with respect to a ground potential (i.e. the output voltage of the half bridge). The signal conditioning circuit 12 is adapted for providing a set signal S131 with set pulses and a reset signal S132 with reset pulses. At a rising edge of the input signal S121 the set signal S131 is set from a low level to a high level, and at a corresponding edge of the phase-feedback signal (i.e. the output of the half bridge) S122 the set signal is reset to a low level after a certain delay time TD has elapsed. At a falling edge of the input signal S121 the reset signal S132 is set from a low level to a high level, and at a corresponding edge of the phase-feedback signal S122 the reset signal S132 is reset to low level after the certain delay time TD has elapsed. Substantially the set- and the reset signal may be in the form of set pulses and reset pulses triggered by rising and falling edges of the input signal S121 respectively. The duration of each set pulse (or reset pulse) is determined by the time between a rising edge (or a falling edge) of the input signal S121 and a corresponding edge of the phase-feedback signal S122. To allow for the width of the set- and the reset pulses to be big enough to reliably trigger a latch receiving the set- and the reset signals, a minimum pulse width of the set- and the reset pulses is provided by waiting at least the certain delay time TD before resetting the set or the reset signal from a high level to a low level.

The floating logic circuit 13 receives the set signal S131 and the reset signal S132 and provides on the one hand a floating output signal S141 for controlling the switching state of the high side switch T1 and on the other side a control signal SM3 for controlling the charging process of a bootstrap capacitor C by means of another semiconductor switch M3 (explained below).

The output signal S141 is received by a floating driver 14 which is directly connected to a gate terminal of the high side switch T1 which is realized as an n-channel MOSFET. The floating control signal SM3 is connected to the gate of another semiconductor switch which is realized as a p-channel MOSFET connected between a second power supply terminal Vcc and a first terminal of the bootstrap capacitor C. The first terminal of the bootstrap capacitor C provides a floating bootstrap supply voltage Vbts with respect to the potential of the phase terminal PHS. The second terminal of the bootstrap capacitor C is connected to the source terminal of the high side switch T1, i.e. the phase terminal PHS. The internals of the floating logic circuit 13 will be explained later with reference to FIGS. 3a and 3b.

The input signal S121 is provided by a shoot-through protection-logic 11 which is adapted for protecting the half bridge from cross-conduction. The input signal S121 is substantially a time delayed version of a master signal PWM received by the shoot-through protection-logic 11. The shoot-through protection-logic 11 also provides another input signal S151 for driving the low side switch T2 via driver 15. The input signal S151 is substantially an inverted version of the master signal PWM. The short time delay between the input signal S121 and the other input signal S151 provides that the high side switch T1 is not opened before the low side switch T2 is closed.

Figure 3A:
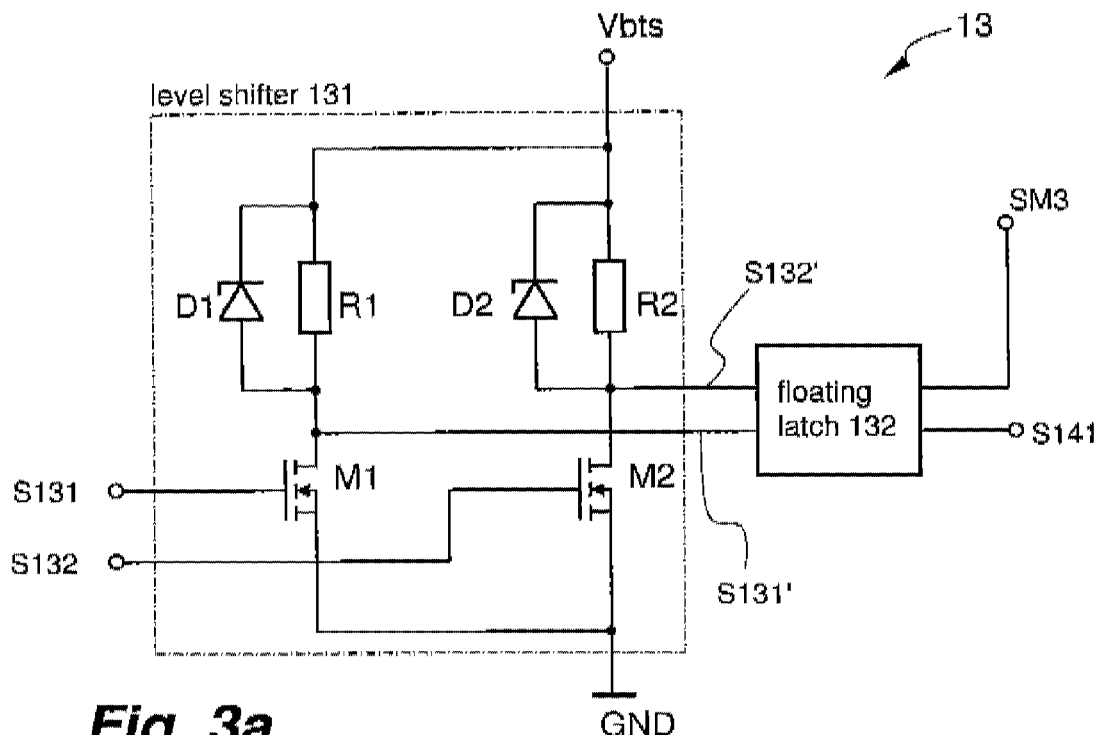
FIG. 3a is a schematic diagram of an illustrative embodiment of the floating logic circuit in more detail, comprising a level shifter and a floating latch.

FIG. 3a shows an illustrative embodiment of the floating logic circuit 13 in more detail. A level shifter 131 receives the set signal S131 and the reset signal S132 and provides inverted and level shifted versions (S131' and S132') thereof. The level shifted and floating versions of the set- and the reset signal (S131', S132') are received by a floating latch 132. The floating latch 132 provides an output signal S141 and a control signal SM3 for controlling the charging of the bootstrap capacitor. The function of the floating latch 132 is explained below by means of timing diagrams shown in FIG. 3b.

The level shifter 131 comprises a first transistor M1 with a source terminal connected to ground potential, a gate terminal receiving the set signal S131 and a drain terminal connected to the bootstrap supply voltage VBTS via a parallel circuit of a resistor R1 and a zener-diode D1. The drain terminal of the first transistor M1 provides the level-shifted and floating version S131' of the set signal. If the set signal S131 received by the gate of the first transistor M1 is on a low level, the transistor M1 assumes a high ohmic state and the drain terminal of the first transistor M1 is pulled up to the bootstrap voltage VBTS by the resistor R1. Consequently the level shifted version S131' of the set signal is at a high level with a voltage VBTS over ground potential GND. When the set signal S131 changes to a high level, the first transistor M1 is switched on and the drain of the first transistor M1 is pulled down to a voltage equal to the bootstrap voltage VBTS minus the zener-voltage Vz determined by the zener-diode D1. The zener-voltage Vz of the diode D1 is approximately as large as the voltage drop over the bootstrap capacitor C. In addition to its level shifting function, the level shifter 131 acts as an inverter. Inverting the set- and the reset signals is not compulsory but may allow for a simpler configuration of the level-shifter 131. To compensate for this inversion, the following floating latch 132 is triggered by low level pulses instead of high level pulses or falling edges instead of rising edges. The level-shifting for the reset signal S132 is completely analogous to the level shifting for the set signal S131. Therefore, a second transistor M2, a second resistor R1 and a second zener-diode D2 are employed.

Figure 3B:
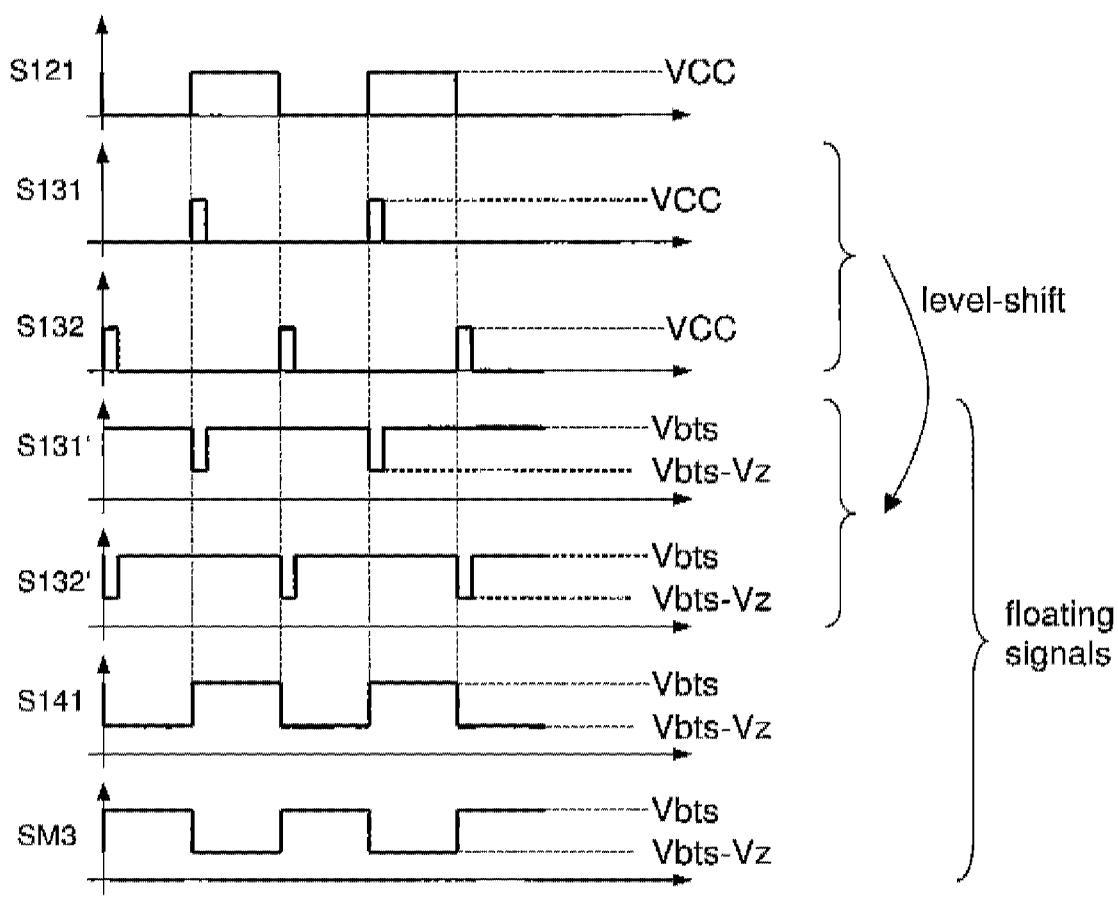
FIG. 3b is an illustrative timing diagram of the signals that may occur in the floating logic circuit shown in FIG. 3A.

The function of the floating logic circuit 13 can be understood easier on the basis of the illustrative timing diagrams shown in FIG. 3b. The first diagram shows one possible input signal S121. Here the duty-cycle of the pulse width modulated input signal is 50 percent. The set signal S131 has a short set pulse at each rising edge of the input signal S121. The reset signal S132 has a reset pulse at each falling edge of the input signal S121. The fourth and the fifth diagram in FIG. 3b show the level-shifted versions of the set- and the reset signal (S131', S132'). The level shifted versions of the set- and reset signals are floating with respect to the phase terminal PHS, i.e. the source terminal of the high-side switch. The floating latch 132 sets the output signal S141 to a high level at a falling edge of the level-shifted version of the set signal S131' and resets the output signal S141 to a low level at a falling edge of the level-shifted version of the reset signal S132'.

In essence the output signal S141 in this example follows the input signal S121, with the only difference that the output signal S141 is floating and does not refer to ground potential (but to the potential of the phase terminal PHS). The control signal SM3 is set to a high level when a reset pulse is received by the floating latch 132 and set to a low level when a set pulse is received by the floating latch 132. In this case the control signal SM3 is substantially an inverted version of the output signal S141.

When the output signal S141 is at a low level, the high side switch is opened and the potential of the source terminal of the high side switch T1 falls close to ground potential GND. In this state the bootstrap capacitor C can be charged and the p-channel MOSFET M3 has to be switched to an on-state in order to charge the bootstrap capacitor C. When the output signal goes to a high level the high side switch T1 is switched on and the potential of the source terminal of the high side switch goes up close to the supply voltage Vin. In that case the control signal SM3 has to change to a low level in order to switch off the p-channel MOSFET M3 inhibiting the discharging of the bootstrap capacitor C.

Figure 4A:
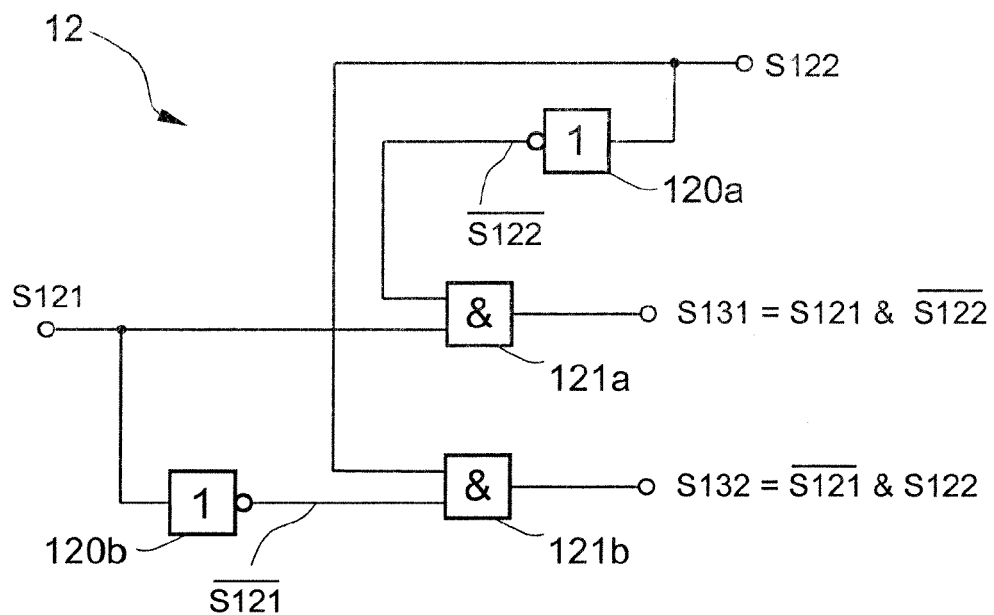
FIG. 4a is a functional block diagram of an illustrative embodiment of the signal conditioning circuit.
Figure 4B:
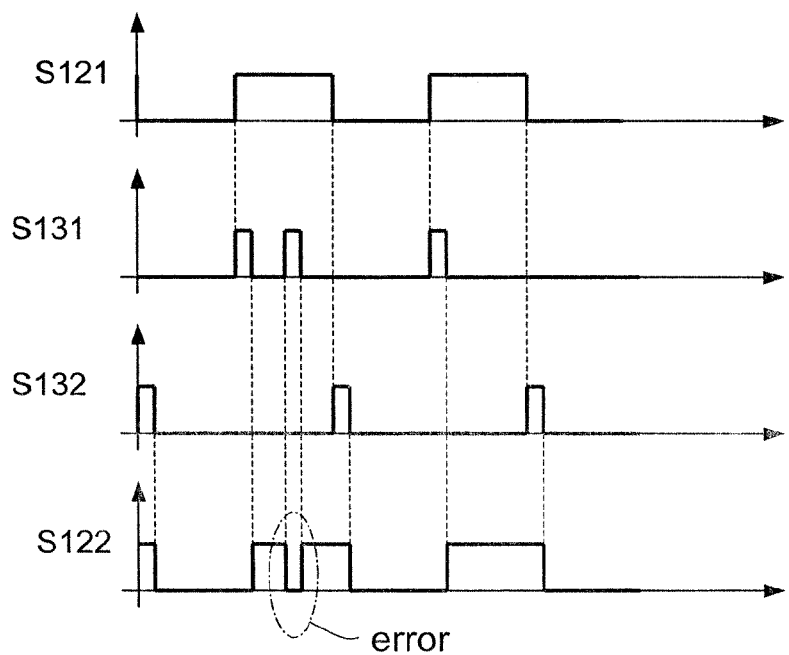

FIG. 4a shows a simplified illustrative schematic of the signal conditioning circuit 12, and FIG. 4b shows illustrative corresponding timing diagrams. It is noted that the implementation shown in FIG. 4a is just an example; there are many ways for realizing the same boolean function. The input signal S121 and the phase-feedback signal S122 are linked together to provide the set signal S131 by the use of a NOT-gate 120a and an AND-gate 121a and to provide the reset signal S132 by the use of a NOT-gate 120b and an AND-gate 121b. The set signal S131 and the reset signal S132 obey the following boolean relation:

$$S131 = S121 \,\&\, \overline{S122} \tag{1}$$

$$S132 = \overline{S121} \,\&\, S122 \tag{2}$$

The effect of the logic circuit shown in FIG. 4a on the signals involved can be seen in the timing diagrams shown in FIG. 4b. The first diagram again shows the input signal S121 with a duty-cycle of 50 percent. At a rising edge of the input signal S121 the set signal S131 is set to a high level and is not reset to a low level before a rising edge in the phase-feedback signal S122 has occurred. If the phase-feedback signal S122 erroneously falls back to a low level during a high level of the input signal S121 another set pulse is triggered due to the phase-feedback. The phase-feedback signal S122 is analogously applied to the reset signal S132. The reset signal S132 is set to a high level at a falling edge of the input signal S121 and is not set back to a low level before a falling edge in the phase-feedback signal S122 has occurred. This use of the phase-feedback may allow set- and reset pulses with a minimal pulse width and may allow the automatic generation of additional set or reset pulses if the phase-feedback signal S122 indicates an erroneous level change due to a glitch which can trigger the floating latch in error.

Figure 5A:
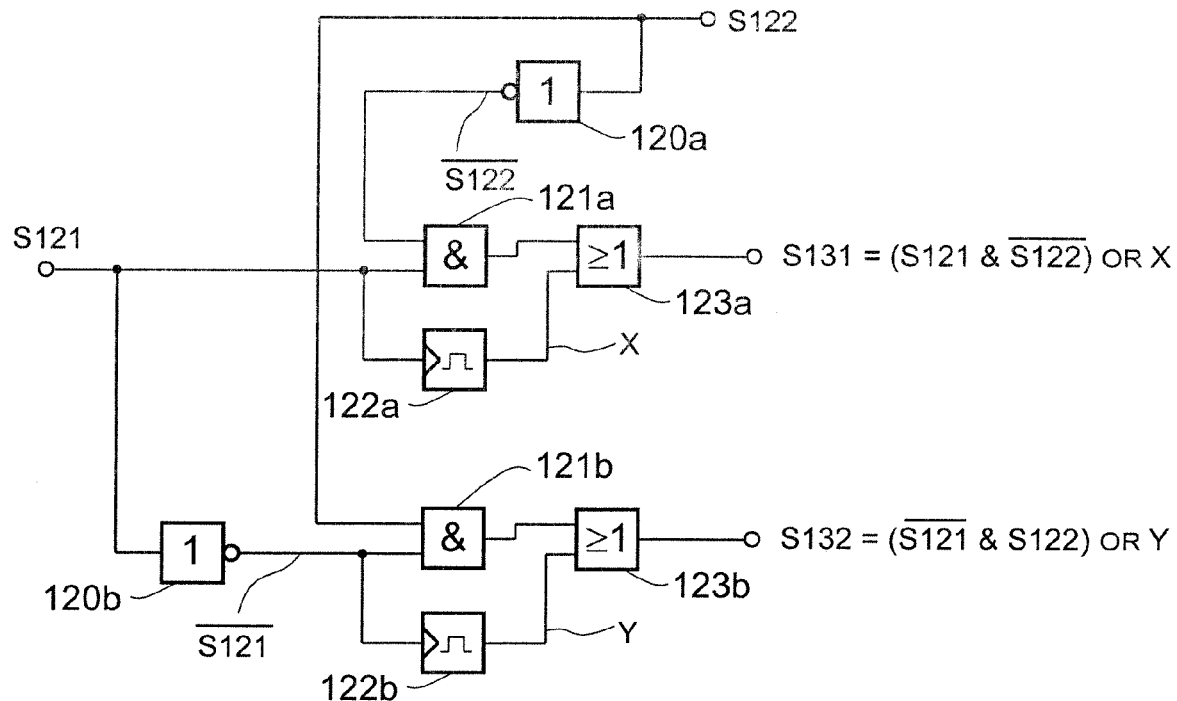
FIG. 5a is a functional block diagram of another illustrative embodiment of the signal-conditioning circuit.
Figure 5B:
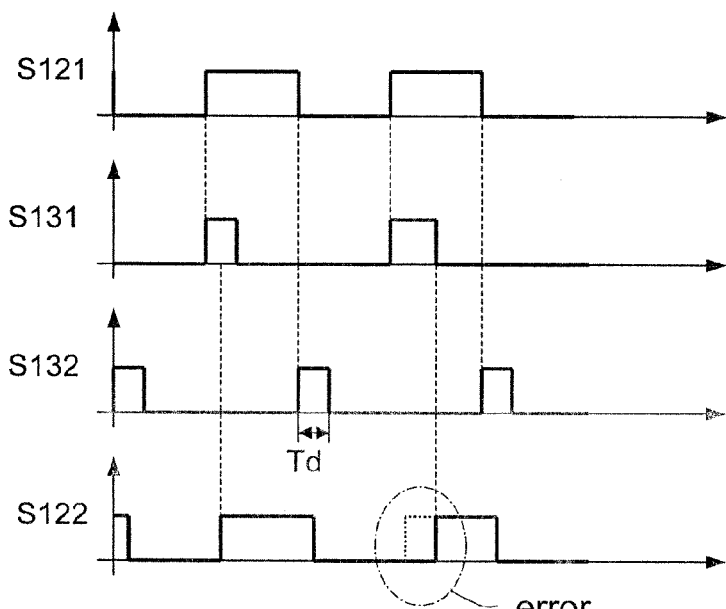

FIG. 5a shows an illustrative modified version of signal conditioning circuit 12, and FIG. 5b shows illustrative corresponding time diagrams. The only difference between the circuit shown in FIG. 4a and the circuit shown in FIG. 5a are the monostable multivibrators 122a and 122b and the ORgates 123a and 123b. The monostable multivibrator 122a is triggered by a rising edge of the input signal S121 and its output X is combined with the output of the end-gate 121a by an or-gate 123a. The output of the OR-gate 123a yields the set signal S131. The other monostable multivibrator 122b is triggered by a falling edge of the input signal S121 and its output Y is combined with the output of the end-gate 121b by the OR-gate 123b. The output of the OR-gate 123b yields the reset signal S132. The set signal S131 and the reset signal S132 obey the following equations:

$$S131 = (S121 \ \& \ \overline{S122}) \ OR \ X \quad (3).$$

$$S132 = (\overline{S121} \ \& \ S122) \ OR \ Y \quad (4).$$

The function of the signal conditioning circuit 12 from FIG. 5a is easily understood with the help of the timing diagrams shown in FIG. 5b. The first diagram shows an illustrative input signal S121 which is a pulse-width modulated signal with a duty-cycle of 50 percent. Like in the previous circuit of FIG. 4a, the set signal S131 is set from a low level to a high level at a rising edge of the input signal S121, but it is not reset to a low level unless a certain time delay TD, which depends on the internals of the monostable multivibrator 120a, has elapsed even if the phase-feedback signal S122 has reacted and changed to a high level in the meantime. Only if the phase-feedback signal S122 erroneously does not change to a high level within the delay time TD the set signal S131 is not reset to a low level before the desired level change in the phase-feedback signal S122 has observed. The reset signal S132 is set from a low level to a high level at a falling edge of the input signal S121 and set back at a corresponding falling edge of the phase-feedback signal S122 but—like the set signal S131—is not set back to a low level before a certain time delay TD has elapsed.

The circuit shown in FIG. 5a behaves essentially like the circuit shown in FIG. 4a, with the only difference being that with the circuit shown in FIG. 5a, a minimum pulse width of the set and the reset pulses is provided.

The circuit arrangement as explained by now may work well as long as the circuit remains in a continuous conduction mode, which would mean that the output current IL provided by the half bridge (T1, T2) would not become zero. The continuous conduction mode is illustrated by way of example on the basis of timing diagrams in FIG. 6a. The first timing diagram shows an illustrative input signal S121 with a duty-cycle of approximately 30 percent. The second timing diagram shows the resulting output current IL in continuous conduction mode. The resulting phase-feedback signal S122 is shown in the third timing diagram of FIG. 6a. The phase-feedback signal S122 substantially follows the input signal S121. The slight slope in the phase-feedback signal S122 is due to the voltage drop over the on-resistance Ron of the high side switch T1 or over the low side switch T2 dependent on the logic level of the phase-feedback signal S122. During an on-cycle of the input signal S122 the phase-feedback signal S122 is given by $$S122 = V_{in} - IL \cdot R_{on}, \quad (5).$$

During an off-cycle of the input signal S122 the phase-feedback signal S122 is given by $$S122 = IL \cdot R_{on}. \quad (6)$$

FIG. 6b shows illustrative timing diagrams valid for the circuit arrangement operating in a discontinuous conduction mode. The first timing diagram again shows an illustrative input signal S121. The resulting output current IL in discontinuous conduction mode does—in contrast to continuous conduction mode—become zero during an off-cycle of the input signal S121. Without any additional provisions the current would become negative, i.e. the current would flow from the load circuit 30 into the half bridge (T1, T2). This behavior (a negative load current IL) may be undesired, because a capacitor in the load circuit or even the bootstrap capacitor C could be discharged. In order to avoid an inverse load current IL a zero crossing of the load current IL is detected and upon a zero crossing of the load current IL the low side switch T2 is switched off, thus inhibiting a reverse output current and making the phase terminal PHS of the half bridge floating. The voltage of the phase terminal PHS is then determined by capacitances in the load circuit 30.

A zero detection device may be provided in an enhanced embodiment for detecting the above-mentioned zero crossing of the output current IL. Such a zero detection device may be easily implemented by using a comparator which detects the phase-feedback signal S122 becoming zero. From equation (5) and (6), as well as from FIG. 6b, it is clear that a phase-feedback signal S122 of zero is equivalent to a load-current IL of zero.

The zero detection device provides a zero-detection signal S123 which indicates a zero-crossing of the output current IL (or of the phase-feedback signal S122) by means of a short pulse with a rising edge at the time the zero crossing occurs.

Figure 7A:
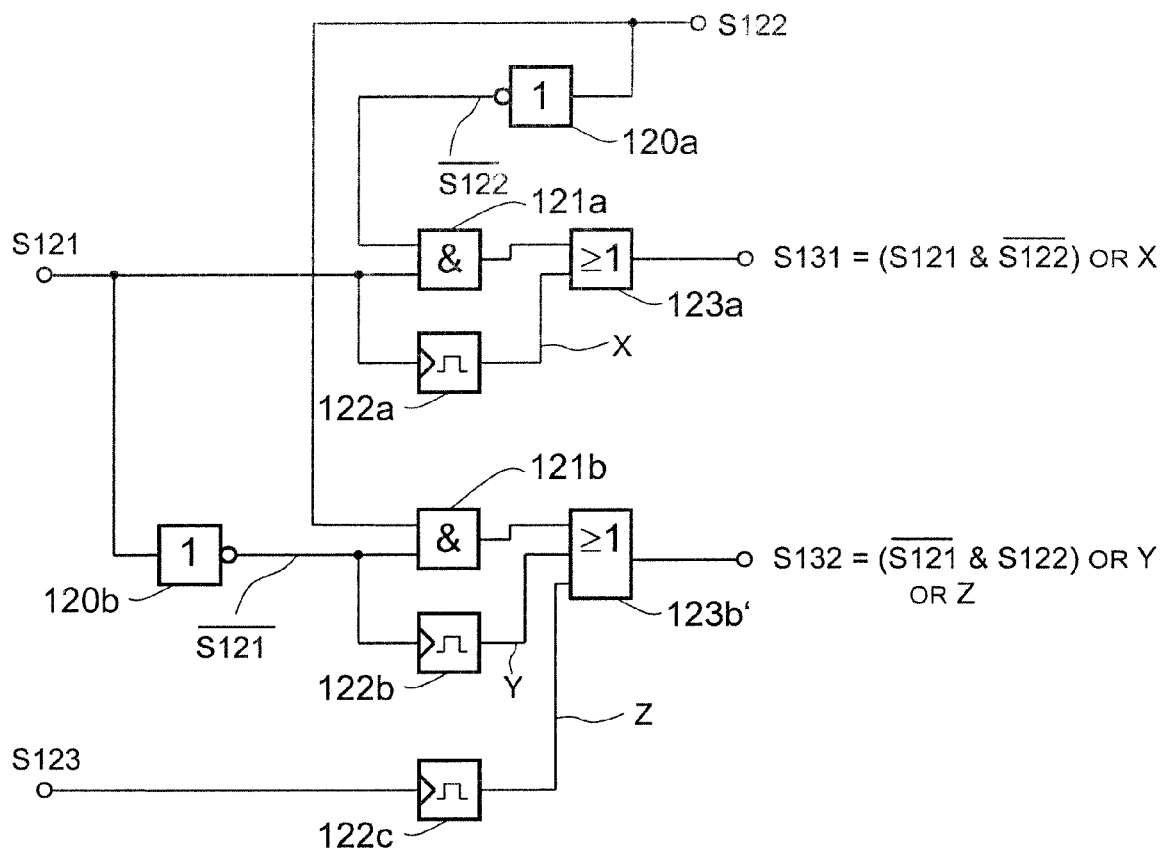
FIG. 7a is a functional block diagram of another illustrative embodiment of the signal-conditioning circuit using a zero-detection signal.

As explained above, the low side switch T2 may be switched off in order to inhibit a negative load current IL. This may not be enough to inhibit a discharge of the bootstrap capacitor C. Therefore, the p-channel MOSFET M3 controlling the charging of the bootstrap capacitor C may be switched off when a zero-crossing of the load current IL is detected. Since the control signal SM3 controlling the switching state of the p-channel MOSFET M3 is also a floating signal with respect to the potential of the phase terminal, the p-channel MOSFET M3 is not switched off by the zero-crossing detection device directly. This may be done via the floating logic circuit 13. Therefore, another modified signal conditioning circuit 12 may be used to transmit the zero-detection signal S123 to the floating logic circuit 13. An example of such an embodiment of the signal-conditioning circuit 12 is shown in FIG. 7a. The circuit is substantially like the circuit shown in FIG. 5a, with the only difference that another monostable multivibrator 122c and a three input OR-gate 123b' is used to trigger an additional reset pulse at a rising edge in the zero-detection signal S123. More precisely, a rising edge in the zero detection signal S123 triggers a short pulse by the use of the monostable multivibrator 122c. This signal Z is combined with the output of the AND-gate 121b and the monostable multivibrator 122b by the use of the three-input OR-gate 123b'. The output of this OR-gate 123b' yields the reset signal S132, as follows:

$$S132 = (\overline{S121} \ \& \ S122) \ OR \ Y \ OR \ Z \quad (7).$$

This additional reset pulse triggered by the zero-detection signal S123 is transmitted to the floating latch 132 through the level shifter 131. In this embodiment of the invention the floating latch 132 is adapted such, that the control signal SM3 is set to a low level upon an additional reset pulse while the p-channel MOSFET M3 is in an on-state. This behavior can be easily understood with the help of FIG. 7b.

Figure 7B:
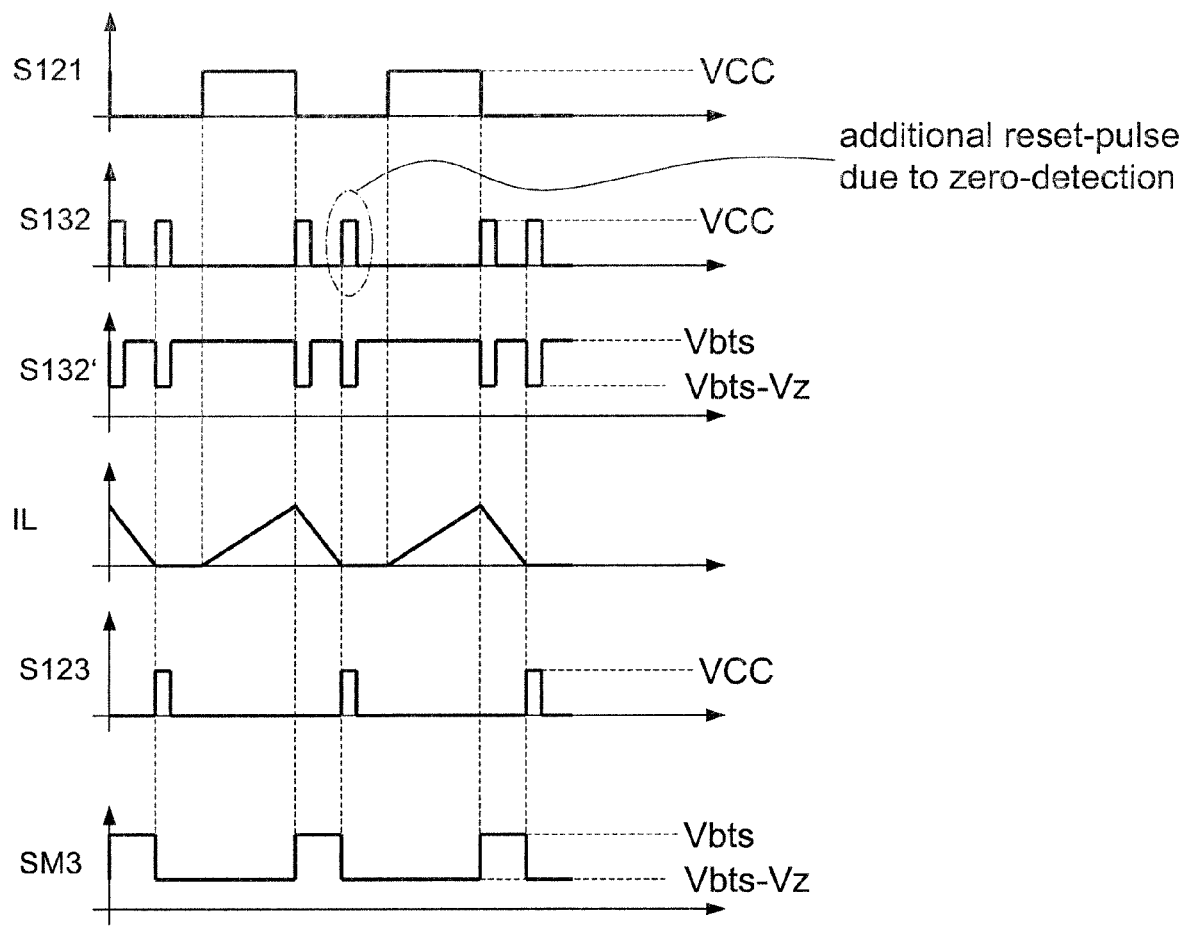

FIG. 7b shows illustrative timing diagrams of the input signal S121, the reset signal S132, the floating version of the reset signal S132', the output current IL, the zero-detection signal S123, and the control signal SM3 controlling the charging of the bootstrap capacitor C. The first timing diagram again shows an illustrative input signal S121 with a duty-cycle of 50%. At the falling edge of the input signal S121 a reset pulse is triggered in the reset signal S132 which is shown in the second timing diagram of FIG. 7b. The third timing diagram shows the floating and level-shifted version S132' of the set signal and the fourth timing diagram shows the resulting output-current IL. If the output-current IL becomes zero, a pulse in the zero-detection signal S123 is triggered and—due to the modified signal conditioning circuit 12 shown in FIG. 6a—this pulse is "copied" into the reset signal S132 and consequently also into the floating and level-shifted version S132'. This additional reset pulse, which is due to the zero-detection in the output current IL, triggers the floating latch 123 setting the control signal SM3 to a low level, thus switching off the p-channel MOSFET M3 and thus stopping the charging of the bootstrap capacitor C.

The logic levels used for all the illustrative signals described herein depend on the actual implementation of the logic circuit and could be inverted depending on the actual implementation of the logic circuit.

The invention claimed is:

1. A circuit, comprising:
    a first circuit portion configured to receive a pulse-width modulated first signal and a second signal, and configured to generate third and fourth signals each responsive to the first and second signals, wherein the first circuit portion is configured to cause the third signal to pulse responsive to a rising edge of the first signal, and to cause the fourth signal to pulse responsive to a falling edge of the first signal;
    a second circuit portion configured to receive the third and fourth signals and to generate a fifth signal responsive to both the third and fourth signals;
    a third circuit portion configured to control an on/off state of a first switch in response to the fifth signal, wherein the second signal is present at a load path terminal of the first switch;
    a capacitor coupled in series with a voltage supply and the load path terminal of the first switch; and
    a second switch coupled to the capacitor and configured to selectively connect and disconnect the capacitor to the voltage supply, wherein the second circuit portion is configured to control an on/off state of the second switch in response to at least one of the third and fourth signals.

2. The circuit of claim 1, further comprising a third switch having a load path coupled in series with a load path of the first switch, wherein the third switch is configured such that an on/off state of the third switch is controlled responsive to a sixth signal which is in turn responsive to a seventh signal, and wherein the first signal is also generated responsive to the seventh signal.

3. The circuit of claim 2, wherein the sixth signal is an inverted and phase-shifted version of the first signal.

4. The circuit of claim 1, wherein the capacitor has a first terminal coupled to the load path terminal of the first switch and a second terminal coupled to the voltage supply through a load path of the second switch.

5. The circuit of claim 1, further comprising a third switch having a load path coupled in series with a load path of the first transistor.

6. The circuit of claim 5, wherein the first switch is as high-side switch and the third switch is a low-side switch.

7. The circuit of claim 1, wherein the first circuit portion is further configured to generate a pulse in the fourth signal responsive to detecting that an output load current at the load path terminal is zero.

8. The circuit of claim 1, wherein the first circuit portion is further configured to generate a pulse in the fourth signal responsive to detecting that a voltage of the second signal is at a predetermined voltage.

9. The circuit of claim 1, wherein the first circuit portion is further configured to generate a pulse in the fourth signal responsive to detecting a zero voltage of the second signal.

10. A circuit configured to drive a first switch, the first switch having a first load terminal coupled to a first supply potential, a second load terminal configured to provide a phase-feedback signal, and a control terminal, the circuit comprising:
    a first circuit portion configured to receive an input signal and the phase-feedback signal, and configured to generate:
        a set signal that attains a first logic level responsive to a first edge of the input signal and that attains a second logic level responsive to a first edge of the phase-feedback signal, and
        a reset signal that attains the first logic level responsive to a second edge of the input signal and that attains the second logic level responsive to a second edge of said phase-feedback signal;
    a second circuit portion configured to receive the set signal and the reset signal and to generate an output signal with respect to a potential of the phase-feedback signal, where the output signal attains the first logic level responsive to a first edge of the set signal and attains the second logic level responsive to a first edge of the reset signal; and
    a third circuit portion coupled to the control terminal of the first switch and configured to receive the output signal.

11. The circuit of claim 10, wherein:
    the first logic level is a high logic level and the second logic level is a low logic level,
    the first edge of the input signal is a rising edge,
    the second edge of the input signal is a falling edge,
    the first edge of the set signal is a rising edge, and
    the first edge of the reset signal is a rising edge.

12. The circuit of claim 10, further comprising:
    a capacitor having a first and a second terminal, the first terminal of the capacitor coupled to the phase-feedback signal; and
    a second switch having a first load terminal coupled to a second supply potential, and a second load terminal connected to the second terminal of the capacitor.

13. The circuit of claim 12, wherein the second circuit portion is configured to turn on the first switch responsive to the first edge of the reset signal and to turn off the switch responsive to the first edge of the set signal.

14. The circuit of claim 10, further comprising a second switch having a first load terminal coupled to the second load terminal of the first switch, a second load terminal coupled to a fixed potential, and a control terminal, wherein the first switch and the second switch together form a half-bridge.

15. The circuit of claim 11, further comprising a zero-current detection device configured to detect a zero-crossing of a current provided by a common node of the first and second switches and to provide a zero-detection signal to the first circuit portion.

16. The circuit of claim 15, wherein the first circuit portion is configured to turn off the second switch responsive to the zero-detection signal indicating a zero-crossing of the current.

17. The circuit of claim 15, where the first circuit portion is configured to cause the reset signal to attain a first logic level responsive to the zero-detection signal indicating a zero-crossing of the current and to cause the reset signal to change back to a second logic level after a delay time.

18. The circuit of claim 17, wherein the second circuit portion is configured to turn off the second switch responsive to the first edge of the reset signal.

19. The circuit of claim 10, wherein the second circuit portion comprises a level-shifter configured to receive the set signal and the reset signal and to generate inverted and level-shifted versions thereof with reference to the phase-feedback signal.

20. The circuit of claim 10, wherein the first circuit portion is further configured to generate the set signal such that the set signal attains the second logic level only if the first edge of the phase-feedback signal has occurred and a predetermined delay time has elapsed since the set signal attained the first logic level.

21. The circuit of claim 20, wherein the first circuit portion is further configured to generate the reset signal such that the reset signal attains the second logic level only if the second edge of the phase-feedback signal has occurred and the predetermined delay time has elapsed since the reset signal attained the first logic level.

22. A method, comprising:
setting a set signal to a first logic level responsive to a first edge of an input signal, and resetting the set signal to a second logic level responsive to a first edge of a phase-feedback signal;
setting a reset signal to the first logic level responsive to a second edge of the input signal, and resetting the reset signal to a second logic level responsive to a second edge of the phase-feedback signal;
level-shifting the set signal and the reset signal to generate floating versions thereof with reference to a potential of the phase-feedback signal;
setting an output signal to the first logic level responsive to a first edge of the floating version of the set signal and resetting the output signal to the second logic level at a first edge of the floating version of the reset signal; and
changing a switch between an on state and an off state depending on the logic level of the output signal.

23. The method of claim 22, further comprising:
charging a bootstrap capacitor in response to a first edge of the reset signal; and
turning off the switch responsive to a first edge of the set signal.

24. The method of claim 23, further comprising:
detecting a zero-crossing of a current;
setting a zero-detection signal to the first logic level responsive to detecting a zero crossing, and then resetting the zero-detection signal to the second logic level after a predetermined delay time has elapsed; and
turning off the switch responsive to a first edge of the zero-detection signal.

25. The method of claim 24, wherein the current emanates from a node between the switch and another switch that together form a half-bridge, the method further comprising turning off the another switch responsive to a first edge of the zero-detection signal.

26. The method of claim 22, wherein generating the set signal comprises generating the set signal such that the set signal attains the second logic level only if the first edge of the phase-feedback signal has occurred and a predetermined delay time has elapsed since the set signal attained the first logic level.

27. The circuit of claim 26, wherein generating the reset signal comprises generating the reset signal such that the reset signal attains the second logic level only if the second edge of the phase-feedback signal has occurred and the predetermined delay time has elapsed since the reset signal attained the first logic level.

28. An apparatus, comprising:
means for setting a set signal to a first logic level responsive to a first edge of an input signal, and resetting the set signal to a second logic level responsive to a first edge of a phase-feedback signal;
means for setting a reset signal to the first logic level responsive to a second edge of the input signal, and resetting the reset signal to a second logic level responsive to a second edge of the phase-feedback signal;
means for level-shifting the set signal and the reset signal to generate floating versions thereof with reference to a potential of the phase-feedback signal;
means for setting an output signal to the first logic level responsive to a first edge of the floating version of the set signal and resetting the output signal to the second logic level at a first edge of the floating version of the reset signal; and
means for changing a switch between an on state and an off state depending on the logic level of the output signal.

* * * * *